United States Patent
Wolf et al.

(10) Patent No.: US 7,702,946 B2
(45) Date of Patent: Apr. 20, 2010

(54) DIGITAL CLOCK FILTER CIRCUIT FOR A GAPPED CLOCK OF A NON-ISOCHRONOUS DATA SIGNAL HAVING A SELECTED ONE OF AT LEAST TWO NOMINAL DATA RATES

(75) Inventors: Michael Joachim Wolf, Mundelsheim (DE); Wolfgang Thiele, Süssen (DE)

(73) Assignee: Alcatel, Paris (FR)

( * ) Notice: Subject to any disclaimer, the term of this patent is extended or adjusted under 35 U.S.C. 154(b) by 1130 days.

(21) Appl. No.: 11/273,081

(22) Filed: Nov. 15, 2005

(65) Prior Publication Data
US 2006/0140222 A1 Jun. 29, 2006

(30) Foreign Application Priority Data
Dec. 23, 2004 (EP) .................................. 04293123

(51) Int. Cl.
*G06F 1/04* (2006.01)
(52) U.S. Cl. .................. 713/503; 370/504; 370/518
(58) Field of Classification Search .............. 713/500, 713/503; 370/504, 518
See application file for complete search history.

(56) References Cited

U.S. PATENT DOCUMENTS 6,404,247 B1 *  6/2002  Wang ........................ 327/158
7,164,297 B2 *  1/2007  Flynn ........................ 327/107
2003/0161350 A1  8/2003  Wolf
2004/0042500 A1  3/2004  Christiansen

FOREIGN PATENT DOCUMENTS

EP    0 742 653 A    11/1996
FR    2 662 885 A    12/1991

OTHER PUBLICATIONS

Santos, Dinis et al., "A CMOS Delay Locked Loop and Sub-Nanosecond Time-to-Digital Converter Chip."

* cited by examiner

*Primary Examiner*—Albert Wang
(74) *Attorney, Agent, or Firm*—Carmen Patti Law Group, LLC

(57) ABSTRACT

A clock filter circuit (20), which serves for filtering the clock of non-isochronous data signals having a selected one of at least two nominal data rates, has an auxiliary clock source (21) that generates an auxiliary clock signal (27) with a pulse repetition rate which is in the range between the at least two predetermined data rates, a delay line (22) connected to the auxiliary clock source (21) for creating a set of mutually delayed copies of the auxiliary clock signal and a multiplexer (23) that switches in a cyclic order between the delayed copies according to predetermined rules, which depend on the selected data rate to generate a filtered clock signal (28). A control circuit determines whether the rate of the filtered clock (28) signal must be increased or decreased as compared to said data signal and controls the multiplexer (23) to delay or advance the cyclical switching accordingly.

11 Claims, 3 Drawing Sheets

US 7,702,946 B2

DIGITAL CLOCK FILTER CIRCUIT FOR A GAPPED CLOCK OF A NON-ISOCHRONOUS DATA SIGNAL HAVING A SELECTED ONE OF AT LEAST TWO NOMINAL DATA RATES

The invention is based on a priority application EP04 293 123.8 which is hereby incorporated by reference.

FIELD OF THE INVENTION

The present invention relates to the field of telecommunications and more particularly to a digital clock filter circuit for a gapped clock of a non-isochronous data signal and a method of filtering a clock signal of a non-isochronous data signal.

BACKGROUND OF THE INVENTION

Network elements in existing transport networks serve for establishing semi-permanent ("cross")connections in the network. Such network elements include crossconnects and add/drop multiplexers. For crossconnecting high bitrate digital signals, it is advantageous to use a synchronous switch matrix. While today transport networks rely basically on the Synchronous Digital Hierarchy (SDH, ITU-T G.707), a new Optical Transport Hierarchy has been defined in ITU-T G.709, where the transport signals are no longer synchronous but asynchronous within a predetermined range of ±20 ppm from a nominal frequency.

Even when the transport signals are not synchronous, a synchronous switch matrix may nonetheless be used, if all payload channels are mapped internally into an common synchronous rate which is higher than the highest payload channel rate. Rate adaptation to the internal rate will be performed by bit stuffing. At the output of the network elements, however, the payload channels must then be de-mapped from the internal rate signal and the stuff bits removed. This will cause non-isochronous bit streams that represent the respective payload channels, since the bit clock of a bit stream has gaps from the removed stuff bits. Therefore, a narrow band phase lock loop (PLL) would be required at each payload channel for converting the non-isochronous bit stream back to an isochronous bit stream. Tight output jitter requirements would apply to this function.

Moreover, in certain applications, it would be advantageous if a network element would be able to process transport signals of different types. For instance, transmission equipment for payload bit rates in the Giga-bit range often provides as an option forward error correction (FEC) to the transport signals. The equipment needs therefore the ability to operate at different bit rates, i.e., with or without FEC, on the basis of configuration. On the other hand, it would be advantageous to provide the capability to process SDH and OTH type signals within the same equipment. For such applications, the bit rates must be accommodated to the actually used signal type, which might become very complex for narrow band PLLs at the outputs a network element. Clock circuits with a low Q factor could provide an automatic bit rate accommodation capability with in a range of ±10% with a single oscillator circuit only. High Q clock circuits, however, would require a separate crystal oscillator for each particular bit rate. A clock filter circuit for destuffed non-isochronous transport signals would hence require a particular voltage controlled crystal oscillator (VCXO) for every payload channel and for every bit rate.

It is therefore an object of the present invention, to provide a simplified clock circuit that can be configured to operate at least at two different bit rates.

SUMMARY OF THE INVENTION

These and other objects that appear below are achieved by a clock filter circuit for a gapped clock of a non-isochronous data signal having a selected one of at least two nominal data rates, which makes use of an all digital PLL for low bandwidth filtering of the gapped payload clock.

In particular, the clock filter circuit has an auxiliary clock source that generates an auxiliary clock signal with a pulse repetition rate which is in the range between the at least two predetermined data rates, a delay line connected to the auxiliary clock source for creating a set of mutually delayed copies of the auxiliary clock signal and a multiplexer that switches in a cyclic order between the delayed copies according to predetermined rules, which depend on the selected data rate, to generate a filtered clock signal. A control circuit determines whether the rate of the filtered clock signal must be increased or decreased as compared to said data signal and controls the multiplexer to delay or advance the cyclical switching accordingly.

The clock filter circuit according to the invention requires less circuit board area, lower component costs and shows a lower power consumption than existing solutions. It allows full integration into AISCs and provides a simple configuration of the clock rate by simply adapting the PLL algorithm (i.e., the rules according to which the switching is performed). Moreover, it is less prone to crosstalk from neighboring channels, which in existing solutions could cause a false lock problem.

The invention requires only a single auxiliary clock source as auxiliary clock for a number of payload channels. While other digital PLLs generate intrinsic jitter that needs to be removed by a subsequent analogue PLL, the proposed solution requires no analogue filtering (—but which does not exclude that an analogue PLL is nevertheless used to improve the clock quality!).

BRIEF DESCRIPTION OF THE DRAWINGS

A preferred embodiment of the invention will be described below with reference to the accompanying drawings, in which.

DETAILED DESCRIPTION OF THE INVENTION

Clock filter circuits are used on the I/O boards of a network element for a transport network. It serves to filter the data clock of payload channels contained in the transport signals to be sent. In the preferred embodiment, each I/O board receives 16 payload channels from the switch matrix of the network element. These channels are then de-mapped from an internal transport frame. Due to the removal of the stuff bits, the de-mapped payload channels are provided at a gapped clock. The clock filter circuit smoothes these gaps and generates a transmit line signal with low intrinsic jitter to meet the requirements defined in the applicable standards. Each payload channel has its own individual clock signal.

On the I/O board, each payload channel coming from the matrix is (after de-mapping from the internal frame) written to a buffer memory at its gapped payload bit clock and read back from the buffer using a filtered read clock. The clock filter circuit that generates the filtered read clock is what the present invention relates to. The recovered payload signals can then be multiplexed to form an outgoing line signal or can be outputted as individual tributaries, depending on what purpose the network element serves for.

According to the invention, each clock filter circuit contains a digitally controlled oscillator (DCO). In the preferred embodiment, the DCO is designed as a configurable reference frequency generator for either STM-16 or OTU1 bit rates and generates a clock signal at a fourth of the target frequency, i.e., 622 MHz for STM-16 or 666.5 MHz for OTU1. The clock output shall comply to the jitter requirements of the target bit rates, i.e., <800 ps broadband jitter for SDH
<450 ps broadband jitter for OTH
<160 ps high frequency band jitter for SDH
<150 ps high frequency band jitter for OTH, in the frequency bands between 5 kHz and 20 kHz for broadband and 1 MHz to 20 MHz for the high frequency band.

The mean frequency between the SDH and the OTU1 rate is 644.297.143 Hz. This frequency is 29/28 times the SDH rate and 29/30 times the OTU1 rate. The SDH rate could be obtained by "stealing" every $29^{th}$ cycle from this mean frequency to generate the number of 622.080.000 cycles per second, which is one fourth of the STM-16 rate. Conversely, the OTU1 rate could be obtained by adding one cycle every 29 cycles to generate the number of 666.514.285.7 cycles per second, which is one fourth of the OTU1 rate.

Figure 1:
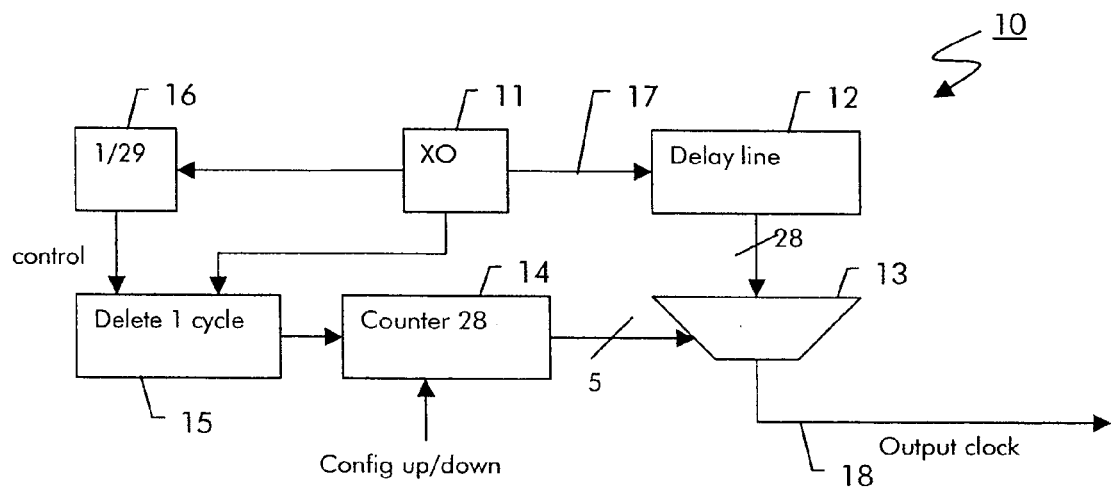
FIG. 1 shows a block diagram of a configurable circuit that generates a clock signal from a fixed auxiliary clock.

A circuit that generates these rates out of the mean rate is shown in FIG. 1. It uses a crystal oscillator 11 as auxiliary clock source to generate the auxiliary clock signal 17 at the mean rate of 644.297.143 Hz. A basic idea of the invention is to switch in a cyclic order between delayed copies of this auxiliary clock. The phase shifts are preferably small enough to meet the jitter requirements. In FIG. 1, a delay line 12 provides 28 phase shifted copies of the auxiliary clock 17. The phase shift between two neighbored clock copies is therefore 55.4 ns. This ensures that even the high frequency jitter is far below the limit when switching between neighbored clock copies.

A multiplexer 13 switches between the delayed copies of the auxiliary clock in a cyclical order. The auxiliary clock signal is also provided to a counter 16 and a gate circuit 15. The counter 16 counts from 1 up to 29 and provides a control signal every $29^{th}$ clock cycle, which causes the gate circuit 15 (i.e., an XOR circuit) to inhibit one clock pulse from the auxiliary clock signal 17. The output of the gate circuit 15 is fed to a second counter 14, which generates a 5 bit control signal for the multiplexer 13. This control signal designates the clock copy to which the multiplexer 13 has to switch over. The second counter 14 can be configured to count either up or down from 1 to 28 or from 28 to 1, respectively.

The operation of the clock circuit 10 is as follows: For the SDH clock of 622 MHz, the counter 14 counts downwards and multiplexer 13 switches to the more delayed clock copy with every cycle of the auxiliary clock for 28 consecutive cycles and as a $29^{th}$ step, to keep the selected clock copy for two cycle. By shifting 28 times, one clock cycle in the output clock 18 is lost as compared to the auxiliary clock. In other words, the multiplexer 13 outputs only 27 cycles while the auxiliary clock generates 28 cycles and in the $29^{th}$ cycle, the selected clock is kept for one further cycle, which produces the $28^{th}$ cycle in the output clock 18.

The last step of keeping the selected copy for two rather than for only one clock cycle provides the potential for further reduction of the output clock 18 and hence for adapting the output clock 18 to changed signal condition by controlling the $28^{th}$ and $29^{th}$ steps as will be explained below. If the selected clock copy is kept also in the $28^{th}$ step, the phase of the output clock 18 decreases by 55.4 ps and if the in the $29^{th}$ step the next copy is selected rather than keeping the selected copy for a second cycle, the output clock phase increases by 55.4 ps. This allows a modification of the output clock 18 in the range of ±1189 ppm, which is by far enough for the required ±20 ppm.

For generating the OTU1 rate, counter 14 counts upwards and multiplexer 13 switches to the less delayed clock in order to gain phase. After shifting 28 times, the output clock 18 has gained one complete clock cycle, i.e. outputs 29 cycles while the auxiliary clock 17 generates 28 cycles, only. In the 29th step, the selected clock copy is kept, which provides a further cycle that adds to the 29 cycles. Thus, the output clock 18 has 30 cycles while the auxiliary clock 17 generates 29 cycles, only.

Figure 2:
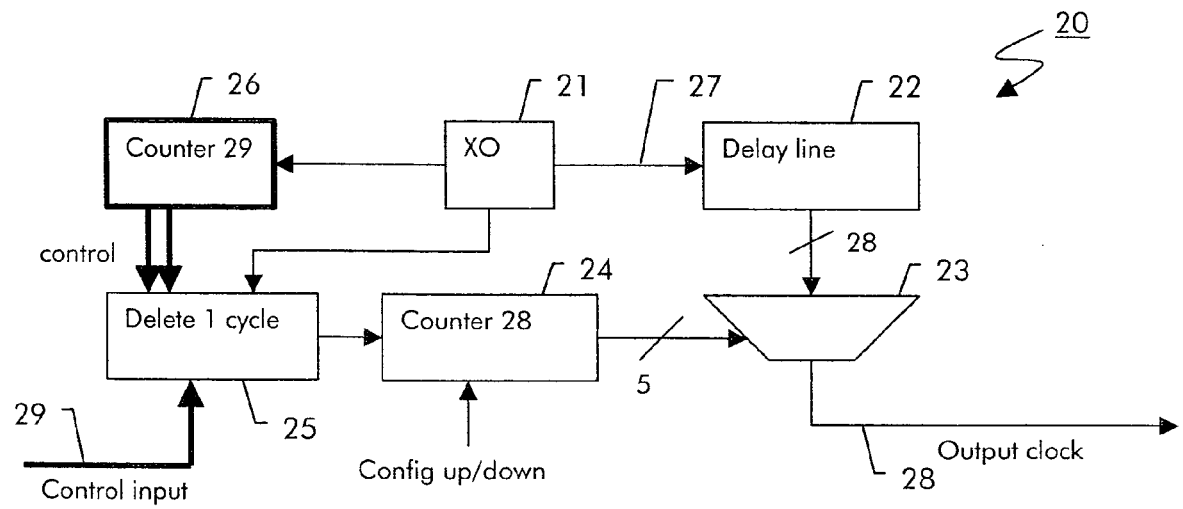
FIG. 2 shows in a block diagram a digital clock filter circuit making use of the circuit of FIG. 1.

The clock circuit shown in FIG. 1 is not jet controllable. In order to make it controllable the gate circuit must be made controllable for the steps 28 and 29. A controllable clock filter circuit 20 is shown in FIG. 2. Same or equal components are designated by reference numerals increased by 10 as compared to FIG. 1.

To allow identifying steps 28 and 29, counter 26 is connected to the gate circuit 25 by a 2 bit output. These two bits indicate the $28^{th}$ and $29^{th}$ step, respectively. Moreover, the gate circuit 25 has a control input 29. Control input 29 will be connected to a comparator (not shown) on the I/O board, which compares the output clock signal 28 with the data signal to be recovered. If the output clock signal 28 is ahead of the data signal, the control signal 29 indicates to delay the output clock 28. Conversely, if the output clock signal 28 lags behind the data signal, the control signal 29 indicates to advance the output clock 28. The frequency control works in a similar way for the OTU1 frequency reference as for the STM-16 frequency reference explained before.

The comparator can be implemented with simple counters that count the gapped bit clock of the data signal to be recovered and the output clock 28, increments the counts over a predefined time interval, and compares these counts. Preferably, the output clock is adjusted in synchronism with the frame clock of the internal frames or an integer multiple thereof. This will reduce waiting time jitter caused by the removed stuff bits.

As an alternative, control input 29 can be connected to a monitor that detects any destuff operations (i.e., gaps) in the payload channel and determines therefrom the control signal that advances or delay switching in multiplexer 23.

The circuits shown in FIGS. 1 and 2 need a crystal oscillator as auxiliary clock source. It should be clear that several clock filter circuits can be supplied by a single crystal oscillator. However, in certain applications, a reference frequency might be already available from another source. This is the case for instance in an SDH network element, where the network element is supplied with an SDH frequency, anyway. In this case, it might be advantageous to derive the auxiliary clock required by the invention from this already available SDH frequency. An alternative auxiliary clock source 31 that derives the auxiliary clock signal from an SDH frequency and that therefore does not require a free-running crystal oscillator is shown in FIG. 3.

Figure 3:
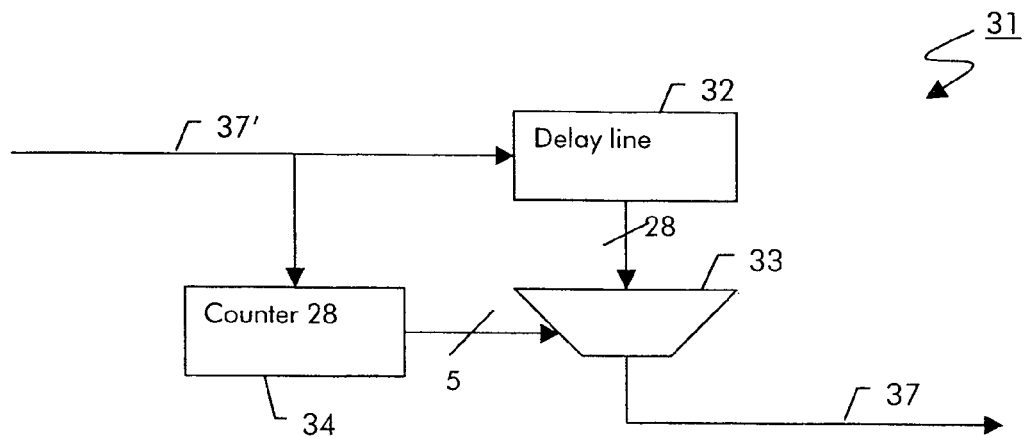
FIG. 3 shows an alternative circuit for generating a fixed auxiliary clock.

The circuit 31 shown in FIG. 3 is suitable to generate the auxiliary clock 37 out of an SDH frequency clock signal 37' that is readily available on the I/O board. A delay line 32 generates 28 delayed copies of the SDH reference clock signal 37'. A counter 34 counts the clock pulses of clock signal 37' and delivers the count values as a 5 bit control signal to a multiplexer 33, which switches in a cyclic order between these copies. Similar to circuit 10 shown in FIG. 1, circuit 31 generates an output clock signal 37 having 29 clock cycles while input clock signal 37' had only 28 cycles. The output signal can thus be used as the auxiliary clock signal 17 or 27 in FIG. 1 or 2, respectively. However, this alternative method of generating the auxiliary clock adds some more intrinsic jitter to the output of the DCO.

Similar as in FIG. 3, the circuit shown in FIG. 1 can be used to generate a free-running OTU1 clock. It is therefore possible to design a STM-12/OTU1 I/O board without a single crystal oscillator.

Figure 4:
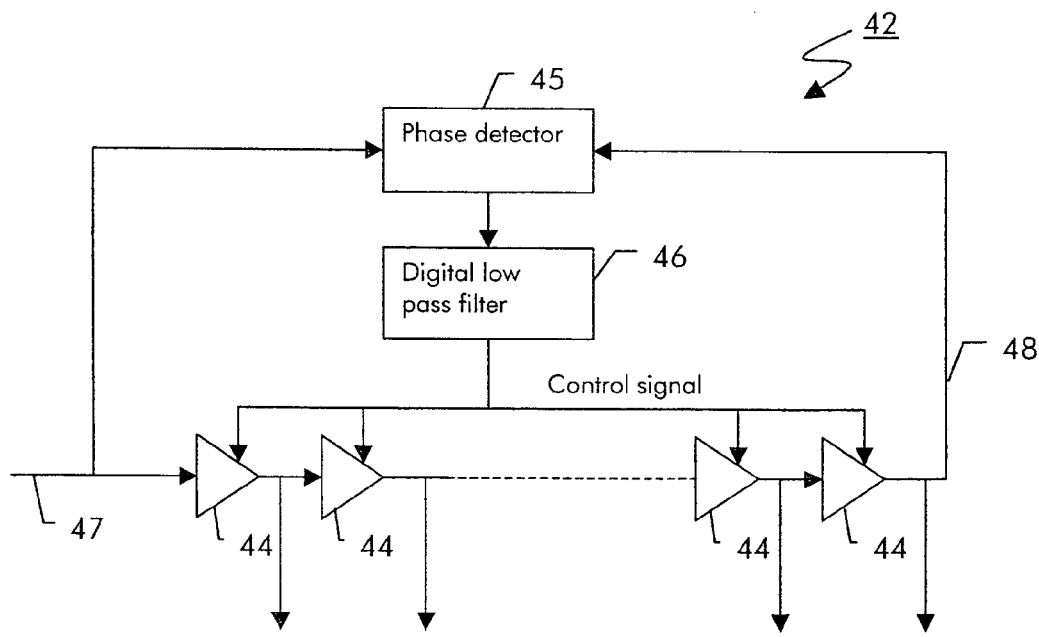
FIG. 4 shows a controlled delay line for use in the circuit of FIG. 2, and FIGS. 5a and 5b show in two diagrams the principle of generating a clock signal by cyclically switching between delayed copies of an auxiliary clock.

FIG. 4 shows an implementation of the delay lines 12, 22, and 32 used in FIGS. 1, 2, and 3, respectively. The delay line 42 is implemented by a series of buffers 44, where each buffer adds more delay to the output of the preceding buffer. The delay of the individual buffers is controlled in such a way to drive the overall delay of the delay line 42 to equal one clock cycle.

This is achieved by phase comparator 45, which compares the phase of the input signal 47 with the phase of the most delayed output signal 48 of the delay line 42 and adjusts the delay values of the buffers accordingly. A digital low pass filter 46 is provided to integrate any variations over time so that no short term phase hits may occur. The delay control is advantageous to compensate for the process specific parameter outcome and for temperature and supply voltage variations.

As an alternative, the delay line can be implemented by loaded delay lines, i.e. by a series of adjustable LC elements. For example, the delay line can be implemented using adjustable varactor diodes.

Another improvement of the invention concerns the multiplexers 13, 23, and 33 in FIGS. 1, 2, and 3, respectively. In order to avoid that the multiplexer switches the clock copies in the vicinity of a clock slope, individual delay elements can be provided for the particular switches within the multiplexer. The delay buffers for the multiplexer control can be controlled by the same control signal that controls the phase shift delay line in FIG. 4.

Moreover, the multiplexer control input from counter 14, 24, or 34, respectively, can be 28 bits parallel instead of 5 bits encoding in order to avoid any delay caused by the decoding of the control signal.

Figure 5A:
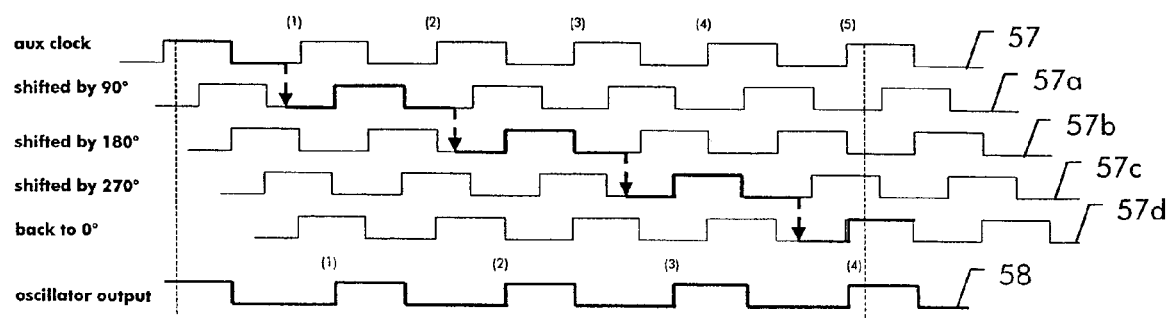
Figure 5B:
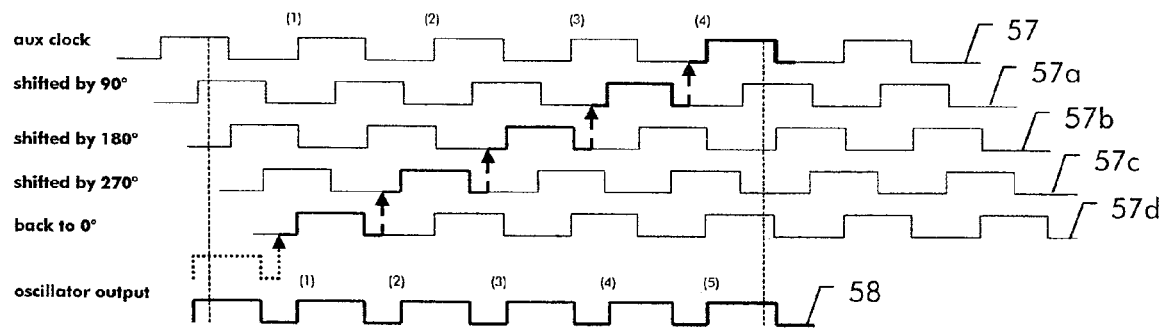

FIGS. 5a and 5b show by way of example the switching principle of the invention: FIG. 5a shows an auxiliary clock signal 57 and four delayed copies 57a-57d, which are delayed in steps of 90° (i.e., π/2 or a fourth of a clock cycle). By switching in a cyclic order from signal 57 to signal 57a, to signal 57b, to signal 57c, to signal 57d, back to signal 57a and so forth, output clock signal 58 is obtained. As can be seen from the figure, the output clock 58 has four clock cycles while the auxiliary clock 57 has five, i.e., the output clock rate is ⅘ from the auxiliary clock rate.

FIG. 5b shows the opposite case, where the output clock signal 58 is obtained by switching in a reverse order from signal 57d to signal 57c, to signal 57b, to signal 57a, to signal 57, back to signal 57c and so forth. In this case, switching is from the more delayed copies to the less delayed copies of the auxiliary clock signal 57. As can be seen from FIG. 5b, the output clock signal 58 has now 5 clock cycles while the auxiliary clock 57 had only four. The output clock rate is hence 5/4 from the auxiliary clock rate.

The clock filter circuit described above is not only useful for network elements employing synchronous switch matrices but also for other systems using cell based or packet based switch matrices, since such matrices inherently produce delay variations, which need to be smoothed by low bandwidth filtering.

What is claimed is:

1. A clock filter circuit for a gapped clock of a non-isochronous data signal having a selected one of at least two nominal data rates, said clock filter circuit comprising:

an auxiliary clock source for generating an auxiliary clock signal having a pulse repetition rate which is in the range in-between said at least two predetermined data rates, a delay line connected to said auxiliary clock source for creating a set of mutually delayed copies of said auxiliary clock signal, a multiplexer for switching in a cyclic order between each of said mutually delayed copies of said auxiliary clock signal in said set of mutually delayed copies according to predetermined rules selected depending on which data rate is selected to generate a filtered clock signal;

and a control circuit for determining whether the rate of said filtered clock signal must be increased or decreased as compared to said data signal and for controlling said multiplexer to delay or advance said cyclical switching accordingly.

2. A clock filter circuit according to claim 1, wherein said control circuit comprises a comparator for comparing said filtered clock signal with said gapped clock of said non-isochronous data signal and for controlling said multiplexer to delay or advance said cyclical switching if said filtered clock signal leads or lags behind said data signal.

3. A clock filter circuit according to claim 1, wherein said auxiliary clock source is a crystal oscillator.

4. A clock filter circuit according to claim 1, wherein said auxiliary clock source comprises a second delay line connected to an external reference clock signal for creating a set of mutually delayed copies of said external reference clock signal, and a second multiplexer for switching in a cyclic order between said delayed copies to generate said auxiliary clock signal.

5. A clock filter circuit according to claim 1, comprising a first counter for counting clock cycles of said auxiliary clock and being connected to said multiplexer for initiating said switching.

6. A clock filter circuit according to claim 1, comprising a second counter connected to said auxiliary clock source for counting the clock cycles of said auxiliary clock and connected to a gate circuit coupled between said auxiliary clock source and said first counter for inhibiting selected clock cycles depending on the count value of said second counter.

7. A clock filter circuit according to claim 1, wherein said delay line comprises a number of buffers connected in series to each other; each buffer providing a certain delay to the output signal of the previous buffer.

8. A clock filter circuit according to claim 7, wherein the delay values of said buffers are adjustable and wherein said delay line comprises a phase comparator for comparing the phase of the auxiliary clock signal with the phase of the most delayed output signal of the delay line and for adjusting the delay of said buffers to drive the phase difference to zero.

9. A method for filtering a gapped clock of a non-isochronous data signal having a selected one of at least two nominal data rates, said method comprising the steps of:

generating an auxiliary clock signal having a pulse repetition rate which is in the range between said at least two predetermined data rates, creating a set of mutually delayed copies of said auxiliary clock signal, switching in a cyclic order between each of said mutually delayed conies of said auxiliary clock signal in said set of mutually delayed copies according to predetermined rules depending on which data rate is selected to generate a filtered clock signal;

determining whether the rate of said filtered clock signal must be increased or decreased as compared to said data signal and delaying or advancing said cyclical switching accordingly.

10. A method according to claim 9, wherein said two nominal data rates include a first data rate from the Synchronous Digital Hierarchy and a second data rate from the Optical Transport Hierarchy.

11. A method according to claim 9, wherein said two nominal data rates include a first data rate for an optical signal having no forward error correction and a second data rate an optical signal having forward error correction.

* * * * *